(12) United States Patent
Park (10) Patent No.: US 8,953,361 B2
(45) Date of Patent: Feb. 10, 2015

(54) STACK MEMORY APPARATUS

(75) Inventor: Nam Kyun Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 271 days.

(21) Appl. No.: 13/601,871

(22) Filed: Aug. 31, 2012

(65) Prior Publication Data

US 2013/0258752 A1 Oct. 3, 2013

(30) Foreign Application Priority Data

Apr. 3, 2012 (KR) ........................ 10-2012-0034444

(51) Int. Cl.
*G11C 11/00* (2006.01)

(52) U.S. Cl.
USPC .............................. 365/148; 365/63; 365/100

(58) Field of Classification Search
USPC ............................................ 365/148, 100, 63
See application file for complete search history.

(56) References Cited

U.S. PATENT DOCUMENTS

| | | | | |
|---|---|---|---|---|
| 7,843,718 B2 * | 11/2010 | Koh et al. | ...................... | 365/148 |
| 7,911,854 B2 * | 3/2011 | Nagashima et al. | ...... | 365/189.06 |
| 8,036,018 B2 * | 10/2011 | Koh et al. | ...................... | 365/148 |
| 8,369,127 B2 * | 2/2013 | Maejima | ....................... | 365/148 |
| 8,477,542 B2 * | 7/2013 | Nagashima et al. | ...... | 365/189.06 |
| 2004/0174732 A1 * | 9/2004 | Morimoto | .................... | 365/148 |
| 2008/0158942 A1 | 7/2008 | Nirschl et al. | | |

FOREIGN PATENT DOCUMENTS

KR  1020090126822  12/2009

* cited by examiner

*Primary Examiner* — Pho M Luu
(74) *Attorney, Agent, or Firm* — IP & T Group LLP (57) ABSTRACT

A stack memory apparatus is provided. The stack memory apparatus includes a semiconductor substrate, and a plurality of memory cells, each including a switching element and a variable resister connected in parallel, stacked on the semiconductor substrate. The plurality of memory cells is configured to be connected to each other in series.

12 Claims, 15 Drawing Sheets

STACK MEMORY APPARATUS

CROSS-REFERENCES TO RELATED APPLICATION

The present application claims priority under 35 U.S.C. 119(a) to Korean application number 10-2012-0034444, filed on Apr. 3, 2012, in the Korean Patent Office, which is incorporated by reference in its entirety.

BACKGROUND OF THE INVENTION

1. Technical Field

The inventive concept relates to semiconductor integrated circuit technology, and more particularly, to a stack memory apparatus.

2. Related Art

With the development of mobile and digital information communication and consumer-electronic industries, conventional devices operating based on control of electron charges in the technical field of mobile and digital information communication may be expected to meet with limits. The development on memory devices with new concept and new functionality other than the devices based on electron charges has been required. In particular, to satisfy the demands on large capacity of the memory device in information handing apparatus, it is necessary to develop next-generation memory devices with large capacity, ultra-high speed, and ultra-low power consumption.

In recent years, as the next-generation memory devices, resistive memory devices using a resistive element as data storage have been suggested. As the next-generation devices, there are typically phase-change random access memory (PCRAM) devices, resistive memory devices, and magnetoresistive memory devices.

The resistive memory device basically includes a switching element and a resistive element. The resistive memory device stores data "1" or "0" according to a resistance stage of the resistive element.

However, the resistive memory device has a critical issue regarding how to improve integration density. There are some concerns about how to integrate memory cells at the maximum in a small area of the resistive memory device.

In the PCRAM device, a diode connected to a word line is used as a switching element. The word line is formed to have a linewidth as narrow as possible to reduce integration density. Accordingly, resistance of the word line is increased. Thus, 'word line bouncing' issue may occur to cause an unstable voltage level on the word line.

A structure including memory cells three-dimensionally stacked has been suggested to overcome the word line bouncing. However, because plural memory cells in the stacked memory device are controlled by one bit line or one word line, it may be difficult to separately control cells on each layer.

SUMMARY

According to one aspect of an exemplary embodiment, there is a memory apparatus. The memory apparatus may include: a semiconductor substrate; and a plurality of memory cells, each including a switching element and a variable resister connected in parallel, stacked on the semiconductor substrate. The plurality of memory cells may be connected to each other in series.

According to another aspect of an exemplary embodiment, the memory apparatus may include: a semiconductor substrate; a common source line formed on the semiconductor substrate; a channel layer formed on the common source line to extend in a direction perpendicular to a surface of the semiconductor substrate; a plurality of gates, each extending in a direction parallel to the surface of the semiconductor substrate from one sidewall of the channel layer, arranged at intervals in the direction perpendicular to the surface of the semiconductor substrate; a plurality of interconnections, each extending in the direction parallel to the surface of the semiconductor substrate from the other sidewall of the channel layer, arranged between adjacent gates; and a plurality of resistive layers, each arranged between adjacent interconnections.

According to another aspect of an exemplary embodiment, there is a memory apparatus. The stack memory apparatus may include: a semiconductor substrate; a plurality of switching transistors located on the semiconductor substrate in a direction perpendicular to a surface of the semiconductor substrate; and a plurality of variable resistors connected parallel to the plurality of switching transistors by a one-to-one correspondence. The plurality of switching transistors and the plurality of variable resistors may be connected in series, respectively.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Figure 1:
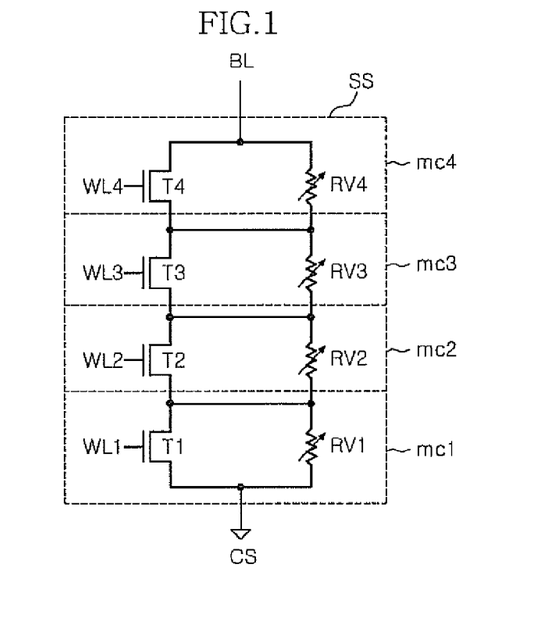
FIGS. 1 and 2 are schematic circuit diagrams illustrating stack memory apparatuses according to exemplary embodiments of the inventive concept.
Figure 2:
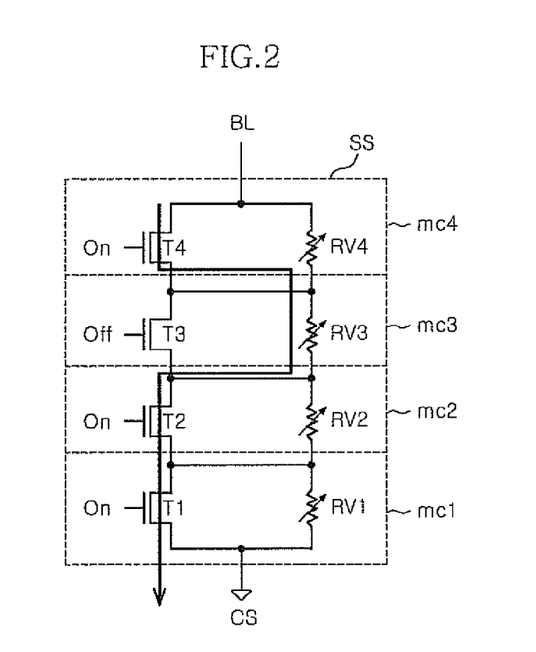

FIGS. 1 and 2 are schematic circuit diagrams illustrating stack memory apparatuses according to exemplary embodiments.

Referring to FIG. 1, a stack memory apparatus according to the embodiment includes a plurality of memory cells mc1 to mc4 connected in series to each other.

The plurality of memory cells mc1 to mc4 connected in series may be located between a bit line BL and a common source line CS. That is, the plurality of memory cells mc1 to mc4 may be sequentially stacked from an upper surface of a semiconductor substrate. In an exemplary embodiment, the plurality of stacked memory cells mc1 to mc4 connected in series is referred to as a stacked string SS.

Each of the memory cells mc1 to mc4 includes one of switching elements T1 to T4 and one of variable resistors Rv1 to Rv4.

The switching elements T1 to T4 may be, for example, switching transistors and connected to the variable resistors Rv1 to Rv4 in parallel. Each of the variable resistors Rv1 to Rv4 may be connected between a drain and a source of each of switching transistors T1 to T4. In addition, gates of the switching transistors T1 to T4 may be connected to word lines WL1 to WL4, respectively.

As shown in FIG. 2, the switching transistor T3 of the memory cell mc3, which is written or read, is turned off. Then, since the turned-off switching transistor T3 has large resistance in the memory cells mc1 to mc4, current may flow through the variable resistor Rv3 corresponding to the turned-off switching transistor T3. Thus, data can be read from or written in the corresponding variable resistor Rv3. In FIG. 2, a current path is indicated by an arrow.

In the exemplary embodiment, for example, when it is assumed that data is read from or written in the third memory cell mc3, a voltage is applied to the third word line WL3 so that the transistor T3 of the third memory cell mc3 is turned off.

Thus, current flows from the bit line BL into fourth memory cell mc4. At this time, the current flows into the third memory cell mc3, passing through the fourth switching transistor T4 which has a lower resistance than that of the fourth variable resistor Rv4.

Since the third switching transistor T3 of the third memory cell mc3 is turned off, the third variable resistor Rv3 has a lower resistance than that of the third switching transistor T3 so that the current passes through the variable resistor Rv3. The current flows into the common source CS, passing through the second memory cell mc2 and the first memory cell mc1.

At this time, the switching transistors T2 and T1 of the second and first memory cells mc2 and mc1 are turned on. Thus the current flows through the switching transistors T2 and T1.

The current path passing through the stacked string SS may be designed to pass through one variable resistor by selective control of the word lines. In this process, read and write operations may be performed to each of the variable resistors Rv1 to Rv4 stacked on separate layers.

FIGS. 3 to 9 are cross-sectional views for processes illustrating a method of fabricating a stack memory apparatus according to an exemplary embodiment.

Figure 3:
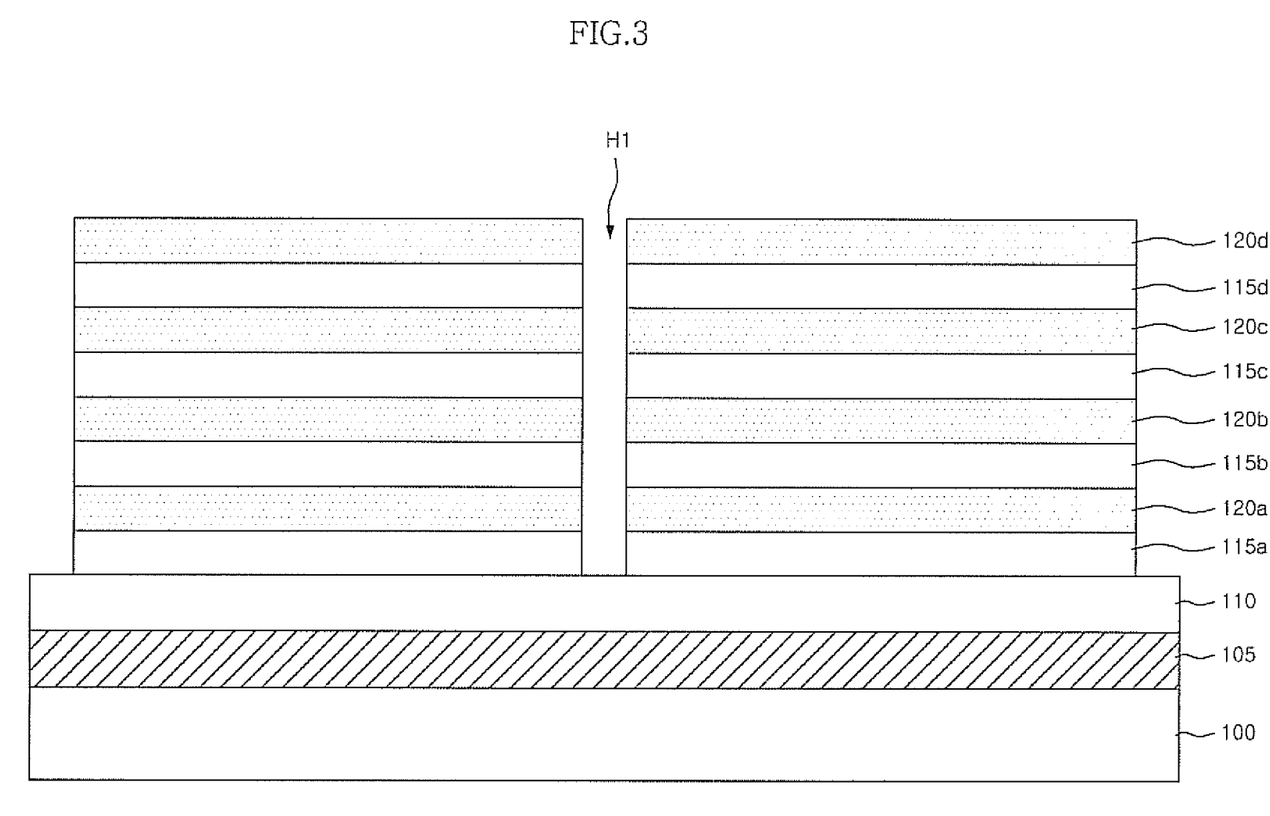
FIGS. 3 to 9 are cross-sectional views for processes illustrating a method of fabricating a stack memory apparatus according to an embodiment of the inventive concept.

Referring to FIG. 3, a common source region 105 is formed on a semiconductor substrate 100. The common source region 105 may include, for example, a conductive layer or an impurity region. A first interlayer insulating layer 110 is formed on the common source region 105. First layers 115a to 115d and second layers 120a to 120d, which have different etch selectivity ratios against each other, are alternately stacked at least once on the first interlayer insulating layer 110. In the exemplary embodiment, the first layer 115a to 115d and the second layer 120a to 120d are stacked alternately four times. The first layers 115a to 115d and the second layers 120a to 120d are etched to form a first hole H1 exposing a portion of the first interlayer insulating layer 110. The first hole H1 may be provided to define a region where two memory cells are formed when viewed in a plan.

Figure 4:
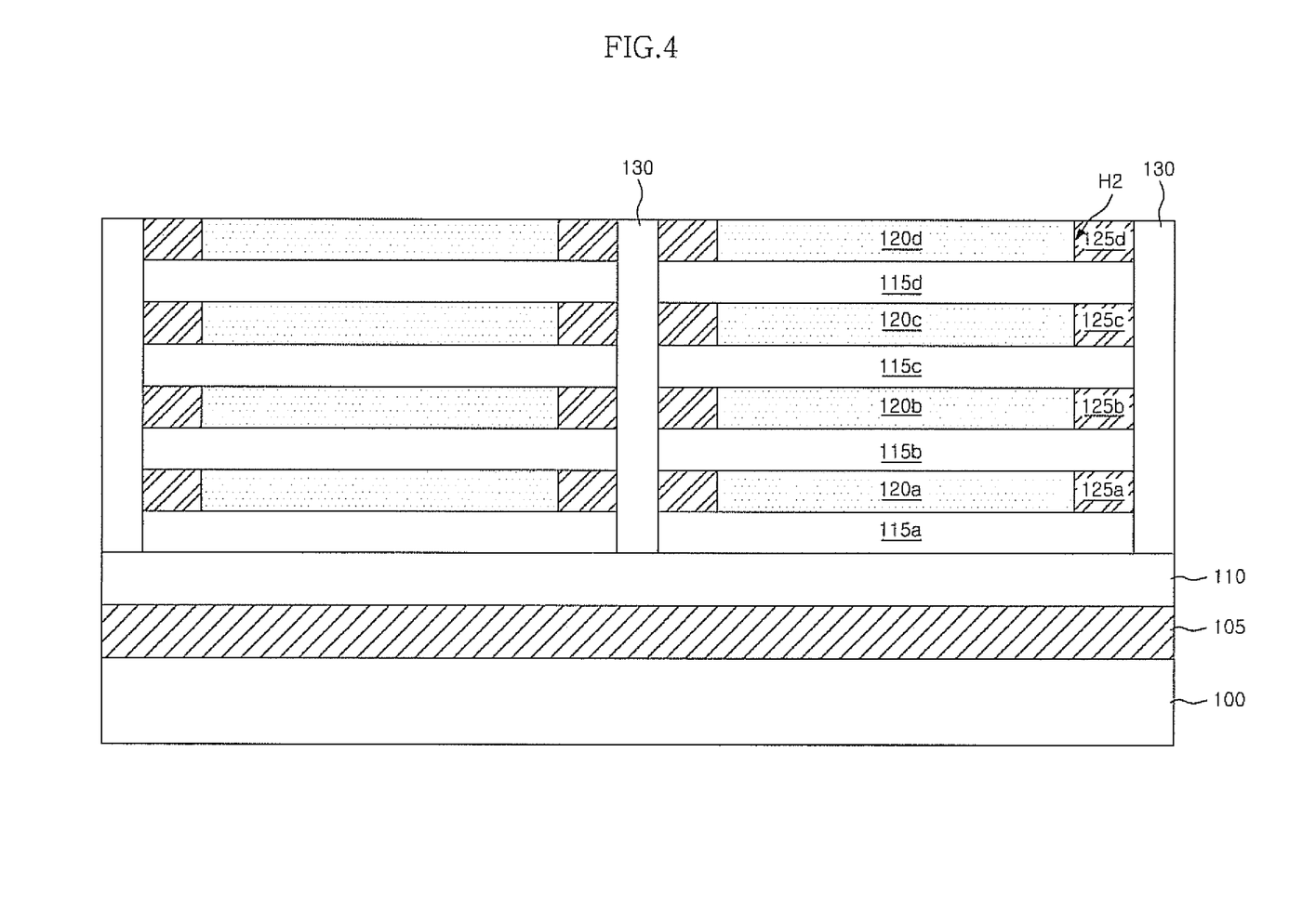

Referring to FIG. 4, an etching material for etching only the second layers 120a to 120d is injected into the first hole H1. The second layers 120a to 120d are removed to form second holes H2. At this time, the first hole H1 may have a vertical shape (a vertical hole shape) with respect to a surface of the semiconductor substrate 100. The second holes H2 may have a horizontal shape (a horizontal hole shape) with respect to the surface of the semiconductor substrate 100. A conductive layer is buried in the second holes H2 through a conventional method to form gates 125a to 125d. Therefore, the gates 125a to 125d have a stacked structure with the first layer 115a, 115b, 115c, and 115d interposed therebetween. The gates 125a to 125d has a structure extending in a direction parallel to the surface of the semiconductor substrate 100 from a sidewall of the first hole H1. Then, an insulating layer 130 is buried within the first hole H1.

Figure 5:
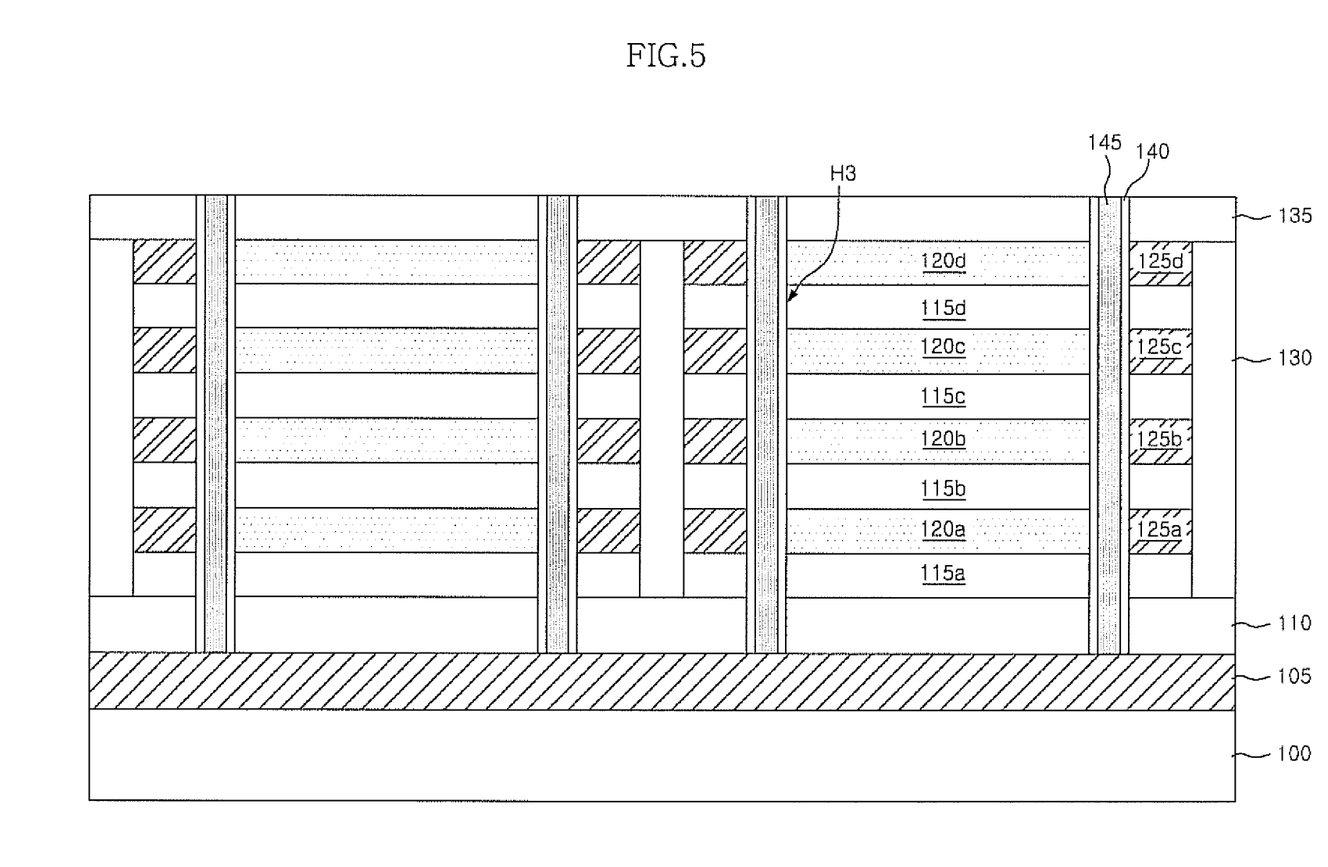

Referring to FIG. 5, a second interlayer insulating layer 135 is formed on a resultant structure. The second interlayer insulating layer 135, the first layers 115a to 115d, the second layers 120a to 120d, and the first interlayer insulating layer 110 are arranged at one side of the gates 125a to 125d (a portion in which the first and second interlayer insulating layers 110 and 135 are present), to form a third hole H3. The third hole H3 may be formed in a vertical shape against the surface of the semiconductor substrate 100 to expose a portion of the common source region 105. A gate insulating layer 140 is formed on an inner wall of the third hole H2 not to cover the common source region 105. A semiconductor layer is buried within the third hole H3 of which the gate insulating layer 140 is formed on the in inner wall to form a channel layer 145. For example, the channel layer 145 may include a Si layer, a SiGe layer, or a GaAs layer.

Figure 6:
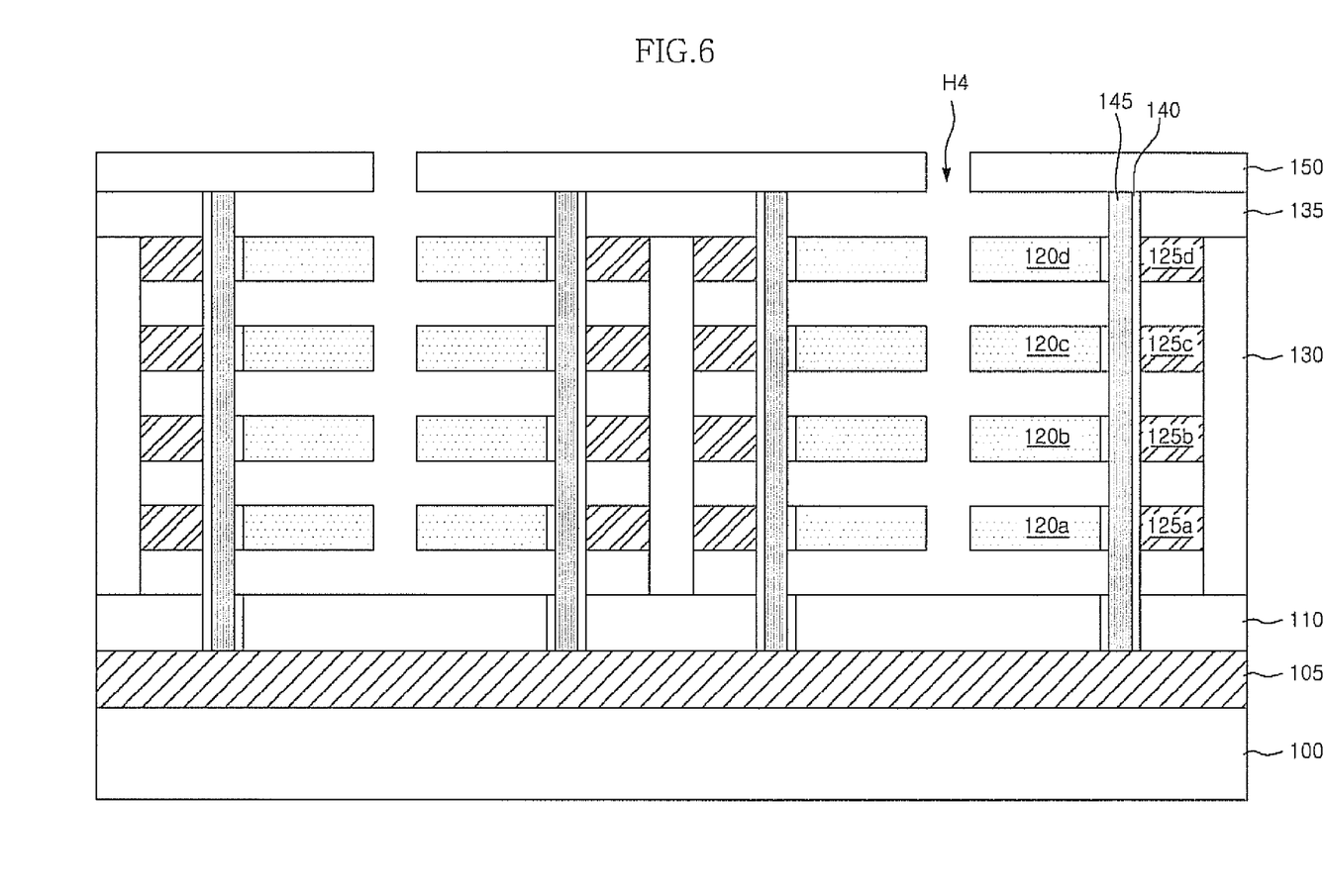

Referring to FIG. 6, a third interlayer insulating layer 150 is formed on a resultant structure. A mask pattern (not shown) is formed to expose a central portion between adjacent channel regions 145. The third interlayer insulating layer 150, the second interlayer insulating layer 135, the first layers 115a to 115d, and the second layers 120a to 120d are selectively removed by a shape of the mask pattern to form a fourth hole H4. The fourth hole H4 has a hole structure of a vertical shape and a horizontal shape.

Figure 7:
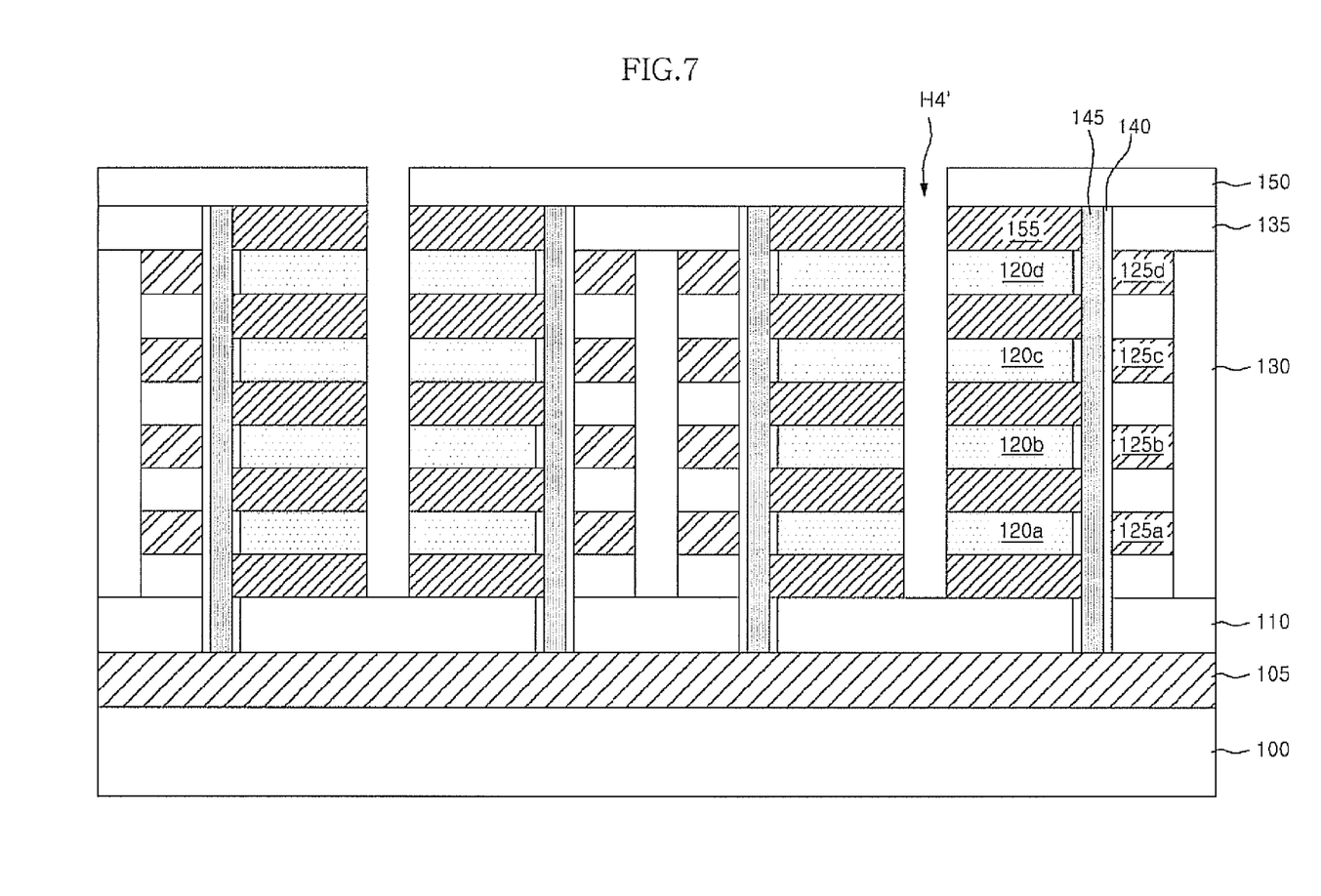

Referring to FIG. 7, a conductive layer is buried in horizontal portions of the fourth hole H4 where the first layers 115a to 115d are removed to form interconnections 155. Although an oxide layer is not shown in FIGS. 6 to 9, an inner surface of the fourth hole H4, i.e., surfaces of the second layer 120a to 120d exposed by the fourth hole H4, can be oxidized to prevent an electric short between the second layer 120a to 120d and the conductive layer, before forming the conductive layer. Thus, the fourth hole H4 is changed into a vertical-shape hole. The interconnections 155 are in electrical contact with the channel layer to serve as conductive interconnections connected to sources and drains, respectively.

Figure 8:
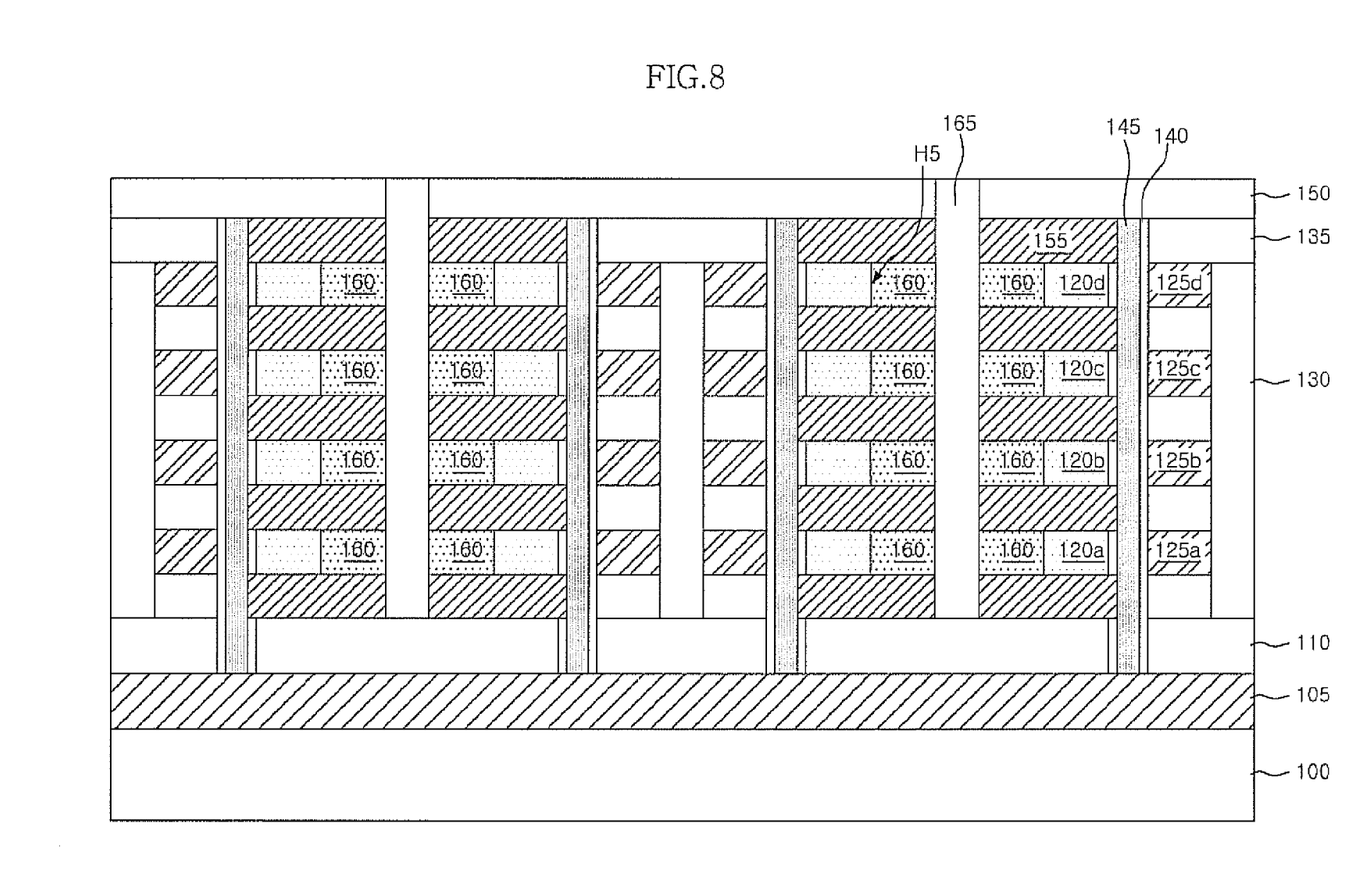

Referring to FIG. 8, the second layer 120a to 120d are etched by a predetermined thickness from a sidewall of the fourth hole H' though a pull-back process to form fifth holes H5. A resistive material is buried within the fifth holes H5 to form variable resistive layers 160. The variable resistive layers 160 may includes a PCMO layer as a resistive memory material, a chalcogenide layer as a phase-change memory material, a magnetic layer as a magnetic memory material, a magnetization switching layer as a spin transfer torque memory random access memory (STTMRAM) material, or a polymer layer as a polymer memory material. Therefore, the variable resistive layer 160 is connected between adjacent interconnections 155 connected to the channel layer 145.

Figure 9:
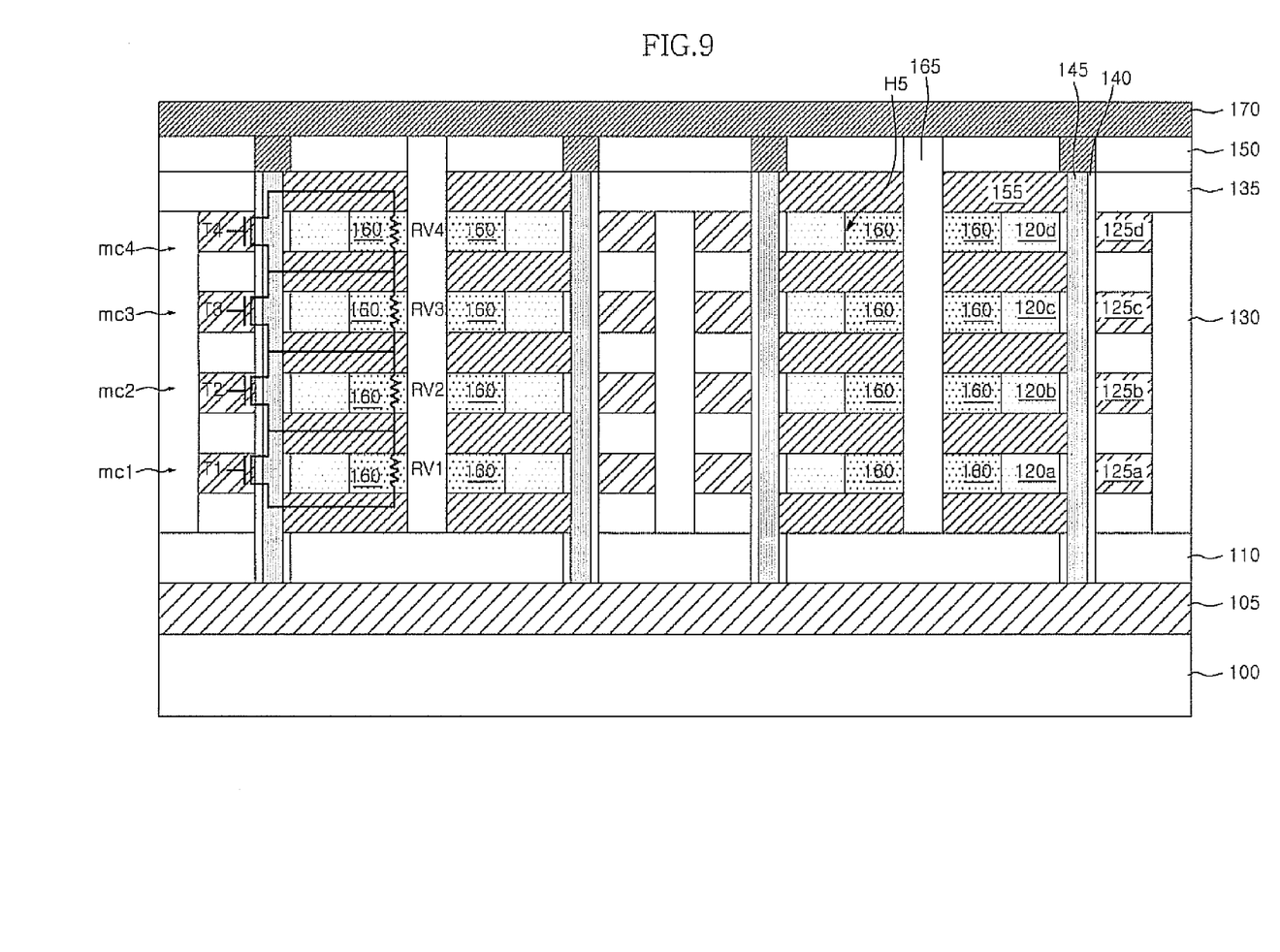

Referring to FIG. 9, an insulating layer 165 is formed to be buried within the fourth hole H4'. Then, a portion of the third interlayer insulating layer 150 is etched to expose the channel layer 145. A conductive layer is deposited on the third interlayer insulating layer 160 to form a bit line 170.

Therefore, MOS transistors serving as the switching elements T1 to T4 are stacked to be connected in series. Further, the variable resistors Rv1 to Rv4 are connected between the interconnections connected to the source and drain of each of the MOS transistors. That is, in the embodiment, the stacked sting may be configured in order to commonly couple the source of the lower switching transistor to the drain of the upper switching transistor, using the channel layer extending perpendicular to the surface of the semiconductor substrate.

Figure 10:
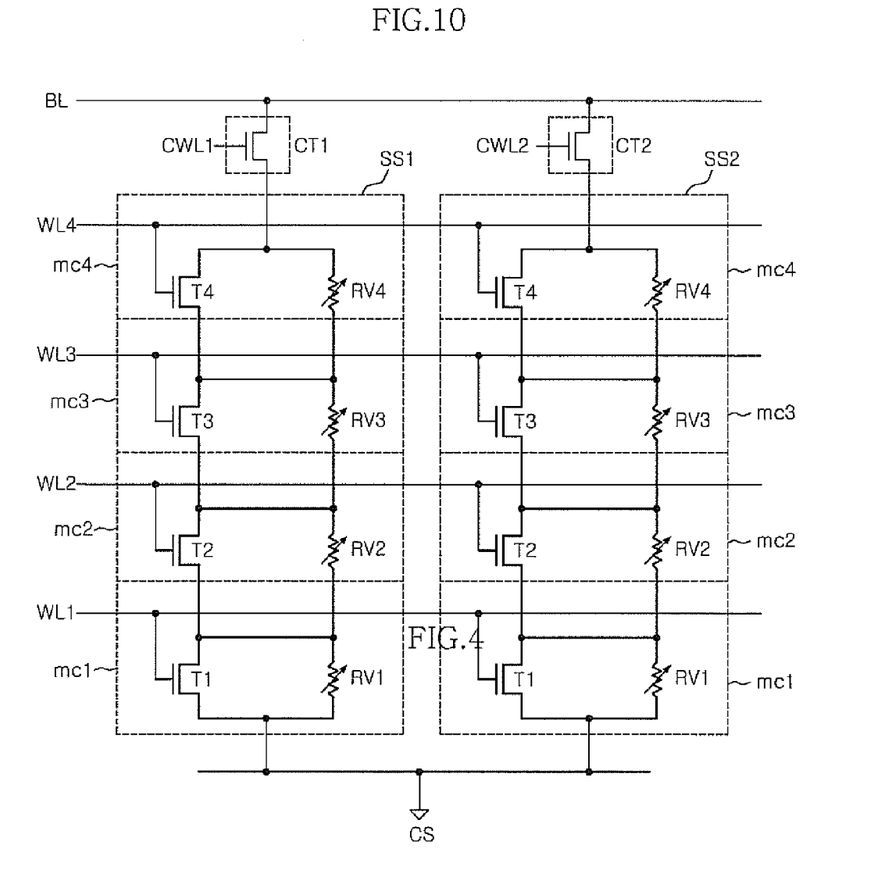
FIG. 10 is a circuit diagram illustrating a stack memory apparatus according to another exemplary embodiment of the inventive concept.

To separately control the stacked strings 551 and SS2 including memory cells stacked in series as shown in FIG. 10, each of control gates CT1 and CT2 may be provided between the bit line BL and each of the stacked strings SS1 and SS2. The control transistors CT1 and CT2 connect the uppermost memory cells mc4 of the stacked strings SS1 and 552 and the bit line BL in response to control word lines CWL1 and CWL2. The control transistors CT1 and CT2 may be respectively formed in each of the stacked strings SS1 and SS.

Figure 11:
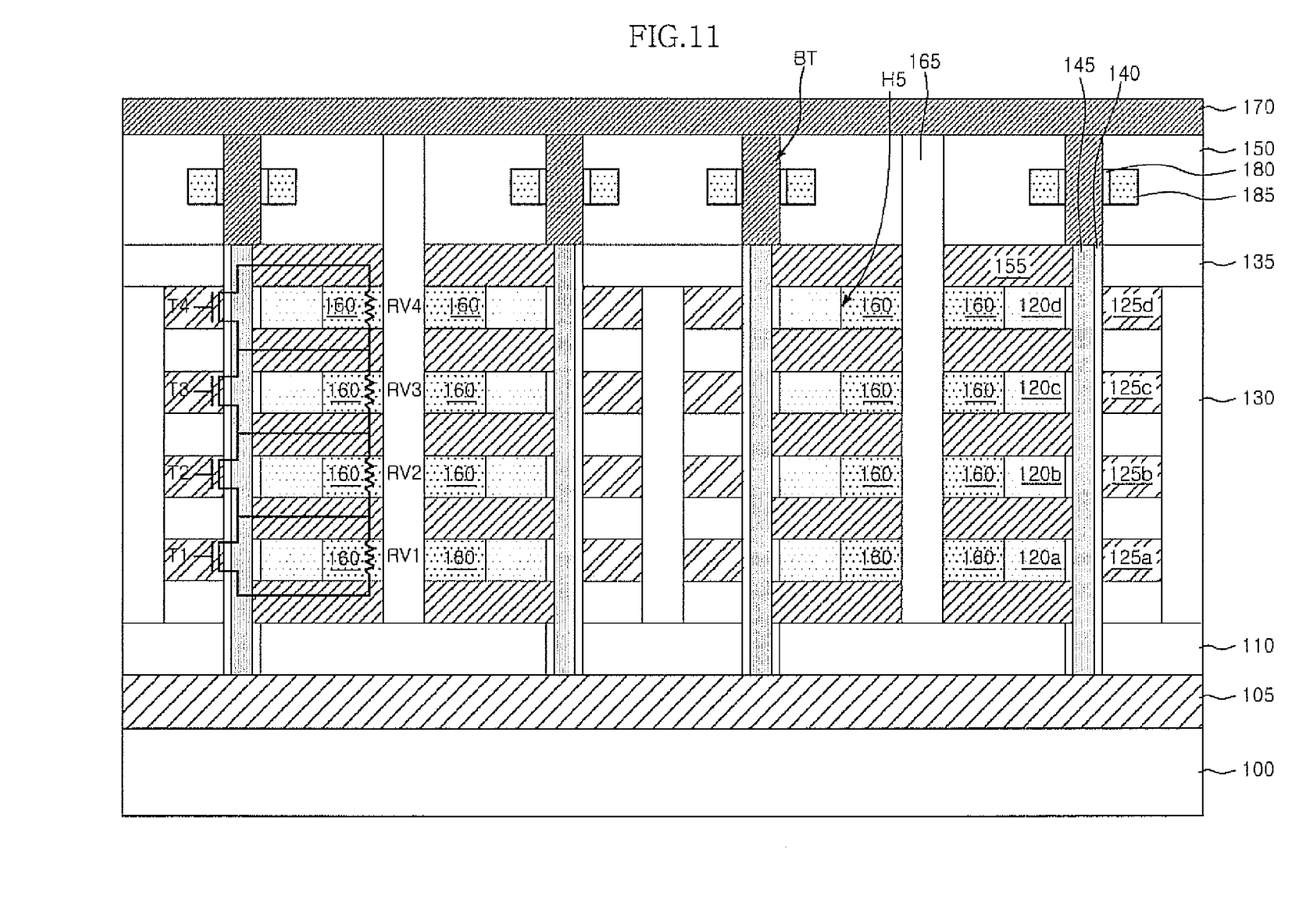
FIG. 11 is a cross-sectional view illustrating the stack memory apparatus of FIG. 10.

As shown in FIG. 11, each of the control transistors CT1 and CT2 may be configured with a MOS transistor using a bit line contact unit BT, which connects the uppermost memory cell mc4 and the bit line 170, as a channel layer. Herein, the control gates CT1 and CT2 may be configured to have a surround gate structure. In FIG. 11, the reference numeral 180 may denotes a gate insulating layer of the control gate, and the reference numeral 185 may denotes a gate of the control gate.

When each of the control gates CT1 and CT2 is formed between the bit line and each of the stacked string SS1 and SS2, channel lengths of the control transistors is determined depending on a thickness of the third interlayer insulating layer 150. Therefore, the thickness of the third interlayer insulating layer 150 may be set by considering the channel length of the control transistor. The bit line contact unit BT may be formed of a semiconductor material to form a channel.

Figure 12:
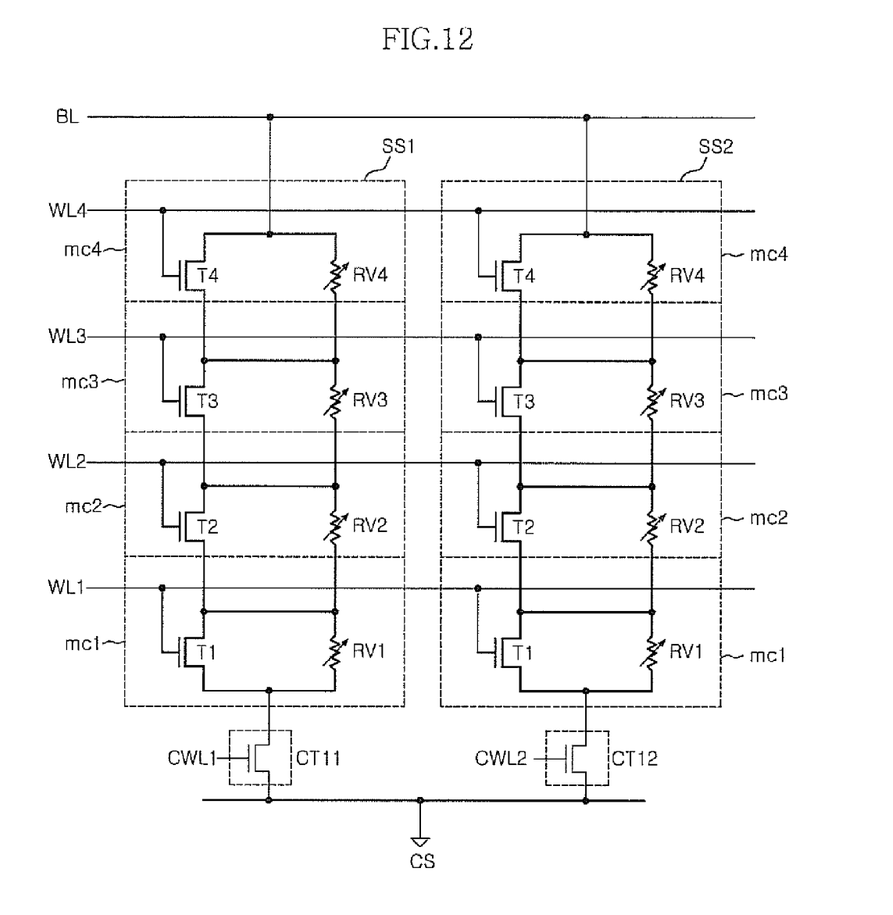
FIGS. 12 to 14 are circuit diagrams illustrating stack memory apparatuses according to other exemplary embodiments of the inventive concept.

As shown in FIG. 12, the control transistors CT1 and CT2 may be connected between the common source line CS and the stacked string SS1 and SS2. Each of the control transistors CT11 and CT12 selectively connects the common source line CS and a lowermost memory cell mc1 of each of the stacked strings SS1 and SS2 in response to each of control word lines CWL1 and CWL2. In the embodiment, the control gates CT11 and CT12 may be configured to a general MOS transistor type between the common source lines CS, i.e., 105, and the first interlayer insulating layer 110.

Figure 13:
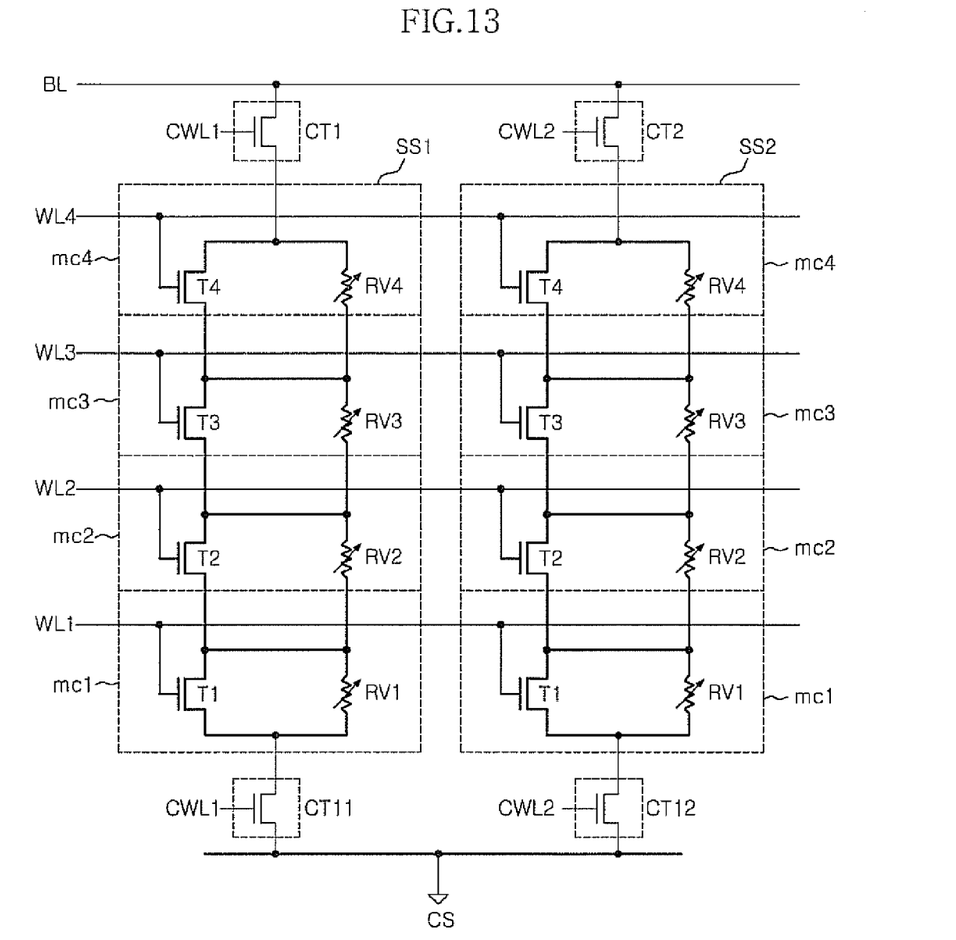

Further, as shown in FIG. 13, the control gates CT1 and CT2 may be formed between the bit line BL and the stacked strings SS1 and SS2. The control gates CT11 and CT12 may be formed between the common source line CS and the stacked strings SS1 and SS2, respectively.

Figure 14:
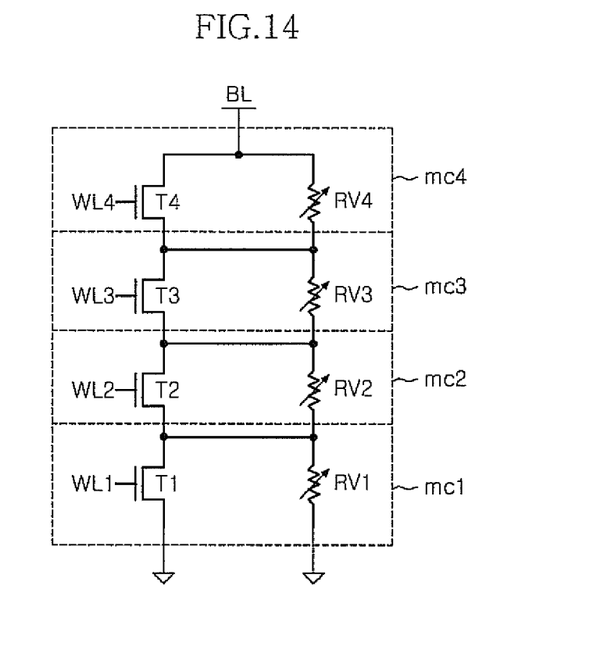

As shown in FIG. 14, without the common source line CS, a source of a switching transistor T1 and a lower electrode (not shown) of the variable resistor Rv1 of the lowermost memory cell mc1 in the stacked string are separated and grounded.

According to the above-described exemplary embodiments, a plurality of unit memory cells is stacked to improve intensity of the memory device. In particular, the memory cells are stacked to be connected in series with each other. Thus, there is no need to consider the interconnections for connecting memory cells and the pitch between the interconnections. Further, it is possible to easily control the memory cells for layers through signal control of the word lines connected to the memory cells. Further, the memory device may have good operation voltage characteristics, using the transistor as a switching element.

However, the inventive concept is not limited to the above-described exemplary embodiments.

Figure 15:
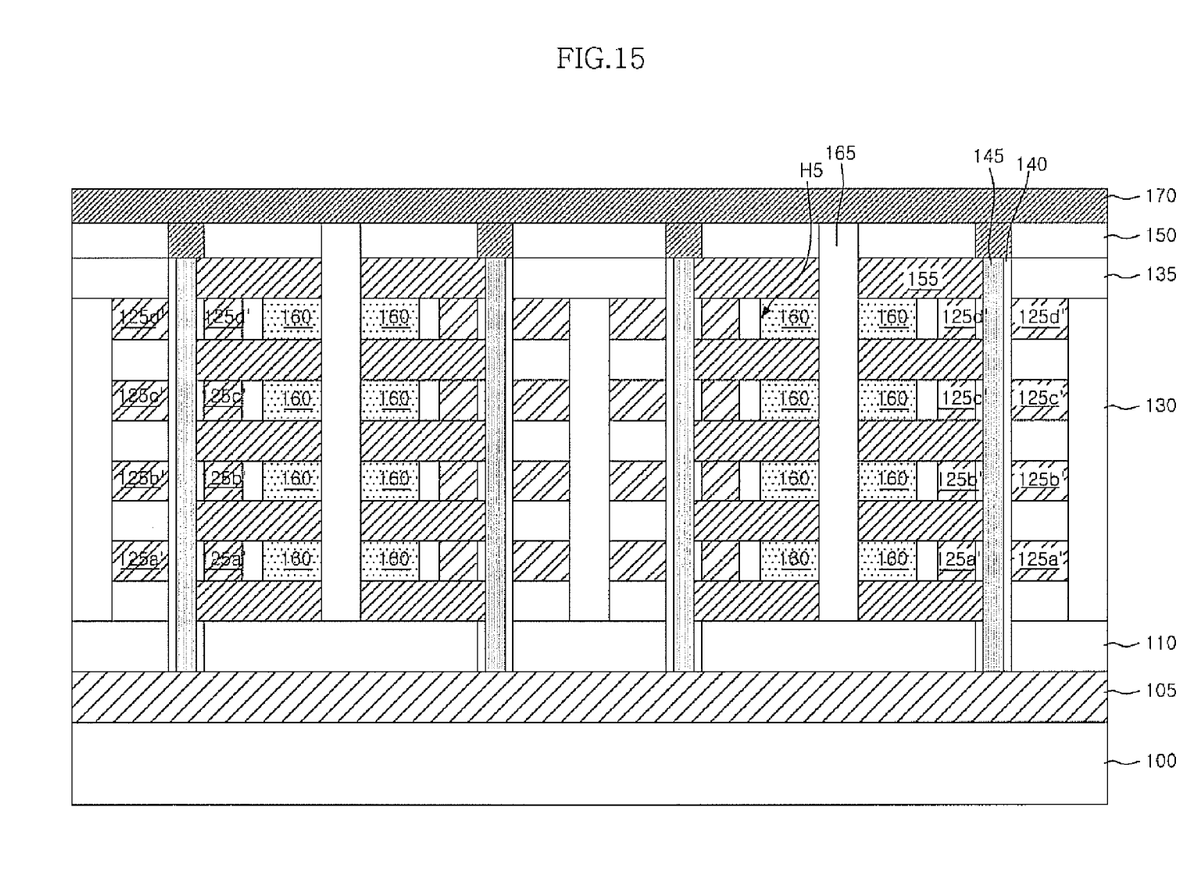
FIGS. 15 and 16 are cross-section views illustrating stack type memory apparatuses according to other exemplary embodiments of the inventive concept.
Figure 16:
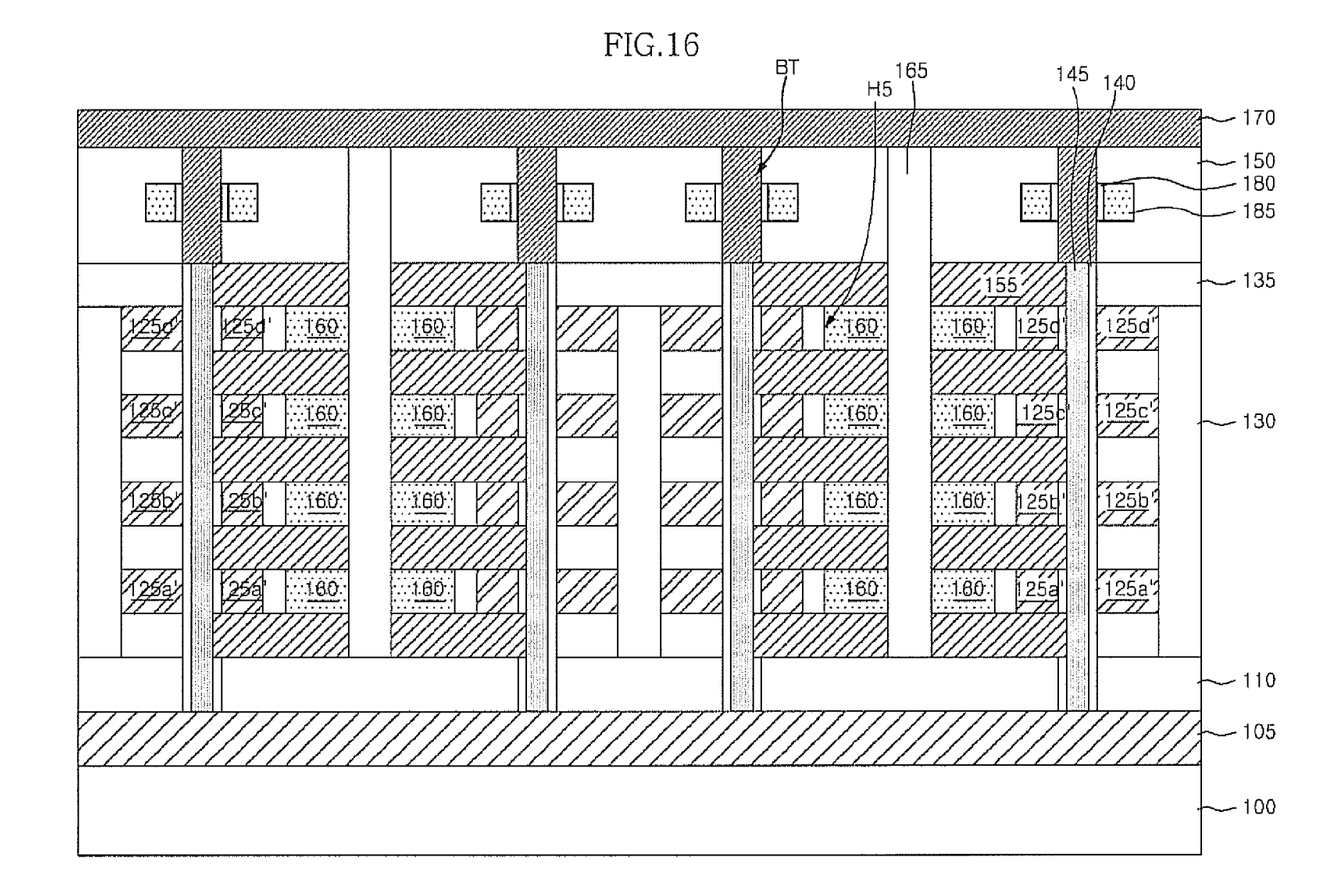

For example, as shown in FIGS. 15 and 16, gates 125a' to 125d of the switching transistors T1 to T4 may be formed in a surround shape where the gates 125a' to 125d' surround a channel layer 145. Therefore, performance of the switching transistors T1 to T4 may be improved. The gates 125a' to 125d' may be obtained by processes of forming a vertical hole for the channel layer 145, forming horizontal holes surrounding the vertical hole through a pull-back process of an insulating layer, and forming a conductive layer within the horizontal contact holes.

While certain embodiments have been described above, it will be understood that the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A memory apparatus, comprising:
a semiconductor substrate;
a plurality of memory cells, each including a switching element and a variable resistor connected in parallel, stacked on the semiconductor substrate; and
a plurality of word lines connected to the plurality of memory cells by a one-to-one correspondence to control operations of the plurality of memory cells,
wherein the plurality of memory cells are configured to be connected to each other in series,
wherein the switching element includes a channel layer extending in a direction perpendicular to a surface of the semiconductor substrate, a plurality of gates extending in a direction parallel to the surface of the semiconductor substrate from one sidewall of the channel layer and arranged at intervals in the direction perpendicular to the surface of the semiconductor substrate, and source and drain interconnections each extending in the direction parallel to the surface of the semiconductor substrate from the other sidewall of the channel layer and arranged between adjacent gates, and
wherein the variable resistor is interposed between the source and drain interconnections to be electrically coupled with the source and drain interconnections.

2. The memory apparatus of claim 1, wherein the switching element is configured such that a source of an upper switching transistor is connected to a drain of a lower switching transistor.

3. The memory apparatus of claim 1, wherein an insulating layer is interposed between the channel layer and the variable resistor.

4. The memory apparatus of claim 1, further comprising a bit line arranged over the plurality of memory cells stacked and electrically connected to an uppermost memory cell of the plurality of memory cells stacked.

5. The memory apparatus of claim 4, further comprising a common source line arranged between the semiconductor substrate and the plurality of memory cells and electrically connected to a lowermost memory cell of the plurality of memory cells stacked.

6. The memory apparatus of claim 5, further comprising a control gate connected between the bit line and the uppermost memory cell or between the common source line and the lowermost memory cell.

7. A memory apparatus, comprising:
a semiconductor substrate;
a common source line formed over the semiconductor substrate;
a channel layer formed over the common source line to extend in a direction perpendicular to a surface of the semiconductor substrate;
a plurality of gates, each extending in a direction parallel to the surface of the semiconductor substrate from one sidewall of the channel layer, arranged at intervals in the direction perpendicular to the surface of the semiconductor substrate;
a plurality of interconnections, each extending in the direction parallel to the surface of the semiconductor substrate from the other sidewall of the channel layer, arranged between adjacent gates; and
a plurality of resistive layers, each arranged between adjacent interconnections,
wherein a selected gate and the resistive layer corresponding to the selected gate are positioned at the same level from the surface of the semiconductor substrate along a direction parallel to the surface of the semiconductor substrate.

8. The memory apparatus of claim 7, wherein a gate insulating layer is interposed between the channel layer and the plurality of gates.

9. The memory apparatus of claim 7, wherein an insulating layer is interposed between the channel layer and each of the resistive layers.

10. The memory apparatus of claim 7, further comprising:
an interlayer insulating layer formed on the channel layer;
a bit line contact unit penetrating the interlayer insulating layer and being in contact with an upper surface of the channel layer; and
a bit line formed on the bit line contact unit.

11. The memory apparatus of claim 10, further comprising:
a control gate configured to surround the bit line contact unit,
wherein the bit line contact unit includes a semiconductor layer.

12. A memory apparatus, comprising:
a semiconductor substrate;
a common source line formed on the semiconductor substrate along a direction parallel to a surface of the semiconductor substrate;
a channel layer formed on the common source line to extend in a direction perpendicular to the surface of the semiconductor substrate;
a plurality of gates each extending in the direction parallel to the surface of the semiconductor substrate from one sidewall of the channel layer and arranged at intervals in the direction perpendicular to the surface of the semiconductor substrate;
a plurality of interconnections each extending in the direction parallel to the surface of the semiconductor substrate from the other sidewall of the channel layer and arranged between adjacent gates;
a plurality of resistive layers each arranged between adjacent interconnections and electrically coupled the adjacent interconnections; and
a plurality of insulating layers interposed between the channel layer and each of the resistive layers, respectively,
wherein a selected gate, a selected resistive layer which corresponds to the selected gate, and a layer positioned at a side of the selected resistive layer make a line which is extended to the direction parallel to the surface of the substrate.

* * * * *